(12) United States Patent
Miyata

(10) Patent No.: US 7,532,071 B2
(45) Date of Patent: May 12, 2009

(54) OPERATIONAL AMPLIFIER CIRCUIT

(75) Inventor: Shinji Miyata, Kasugai (JP)

(73) Assignee: Fujitsu Microelectronic Limited, Tokyo (JP)

( * ) Notice: Subject to any disclaimer, the term of this patent is extended or adjusted under 35 U.S.C. 154(b) by 15 days.

(21) Appl. No.: 11/984,261

(22) Filed: Nov. 15, 2007

(65) Prior Publication Data

US 2008/0122537 A1 May 29, 2008

(30) Foreign Application Priority Data

Nov. 27, 2006 (JP) ............................. 2006-318637

(51) Int. Cl.
*H03F 3/45* (2006.01)
(52) U.S. Cl. ...................................... 330/255; 330/253
(58) Field of Classification Search ................. 330/255, 330/257, 261, 253
See application file for complete search history.

(56) References Cited

U.S. PATENT DOCUMENTS

| 4,379,267 | A | * | 4/1983 | Young | 330/253 |
|---|---|---|---|---|---|
| 5,212,455 | A | * | 5/1993 | Pernici et al. | 330/253 |
| 5,285,168 | A | * | 2/1994 | Tomatsu et al. | 330/253 |
| 5,751,186 | A | * | 5/1998 | Nakao | 327/562 |
| 6,605,993 | B2 | | 8/2003 | Suzuki | |
| 6,794,940 | B2 | | 9/2004 | Suzuki | |
| 6,919,766 | B2 | | 7/2005 | Suzuki | |

FOREIGN PATENT DOCUMENTS

| JP | 06-085570 A | 3/1994 |
|---|---|---|
| JP | 2001-060832 A | 3/2001 |
| JP | 2002-043871 A | 2/2002 |

* cited by examiner

*Primary Examiner*—Henry K Choe
(74) *Attorney, Agent, or Firm*—Arent Fox LLP

(57) ABSTRACT

A level shifter unit outputting a level shifted signal generated by level shifting of output signals of the first and second differential amplifier circuits, and an output circuit including complementary output transistors series being coupled between the high potential power supply and the low potential power supply and inputting the level shifted signal.

5 Claims, 3 Drawing Sheets

Prior Art

OPERATIONAL AMPLIFIER CIRCUIT

CROSS-REFERENCE TO RELATED APPLICATIONS

This application claims the benefit of Japanese Patent Application No. 2006-318637 filed on Nov. 27, 2006, the entire contents of which are incorporated herein by reference.

BACKGROUND

1. Field

The embodiments discussed herein are each directed to an operational amplifier circuit. In recent years, in the field of semiconductor integrated circuit (IC) devices, technological development has rapidly progressed to achieve further reduction in power consumption and power supply voltage. For an operational amplifier circuit onto a semiconductor IC device, it is necessary that an allowable range of an input signal voltage is expanded to a power supply voltage range, and stabilized operation is secured.

2. Description of the Related Art

FIG. 1 illustrates a conventional operational amplifier circuit. The operational amplifier circuit has a configuration including first and second differential amplifier circuits, $1a$ and $1b$, which respectively receive input signals IN1 and IN2, a level shifter unit 2, which receives output signals of the respective differential amplifier circuits $1a$ and $1b$, and an output circuit 3 to be driven by the level shifter unit 2.

The first and second differential amplifier circuits $1a$ and $1b$ are provided in order to output an output signal OUT at a full amplitude from the output circuit 3 even in the event the respective input signals IN1 and IN2 approach either the level of a high electrical potential power supply Vcc or low electrical potential power supply Vss (the "electrical potential" hereinbelow will be simply referred to as "potential").

More specifically, when the input signals IN1 and IN2 approach the level of the power supply Vcc, the second differential amplifier circuit $1b$ does not substantially operate while the first differential amplifier circuit $1a$ operates and outputs an output signal of its own to the level shifter unit 2.

Alternatively, when the input signals IN1 and IN2 approach the level of the power supply Vss, the first differential amplifier circuit $1a$ does not substantially operate while the second differential amplifier circuit $1b$ operates and outputs an output signal of its own to the level shifter unit 2.

Still alternatively, when the input signals IN1 and IN2 are each at an intermediate level between the power supplies Vcc and Vss, the first and second differential amplifier circuits $1a$ and $1b$ both operate.

In the level shifter unit 2, nodes N1 and N2, having level shifted the output signals of the first and second differential amplifier circuits $1a$ and $1b$, are connected to gates of a pull-up transistor T1 and a pull-down transistor T2 of the output circuit 3. The level shifter unit 2 generates a certain level shifted voltage $\Delta V$ between the nodes N1 and N2.

The level shifted voltage $\Delta V$ preferably satisfies expression (1) below:

$$\Delta V = Vcc - (Vgsp1 + Vgsn2) \quad (1)$$

Where Vgsp1 is a gate-source voltage of the transistor T1 of the level shifter unit 2, when the output current of the output circuit 3 is an ideal value I2; and Vgsp2 is a gate-source voltage of the transistor T2 of the level shifter unit 2, when the output current of the output circuit 3 is an ideal value I2.

More specifically, a current I1 is represented by expression (2) below:

$$I1 = (Vcc - Vgsn3)/R1 \quad (2)$$

where Vgsn is a gate-source voltage of a transistor T3 of the level shifter unit 2.

The level shifted voltage $\Delta V$ is represented as expression (3) below:

$$\Delta V = R2/R1 \times (Vcc - Vgsn3) \quad (3)$$

Accordingly, it is preferable that expression (4) below is satisfied:

$$Vcc - (Vgsp1 + Vgsn2) = R2/R1 \times (Vcc - Vgsn3) \quad (4)$$

where R1 and R2 are resistors of the level shifter unit 2.

For example, a relational expression of the above takes the form of expression (5) shown below when, for example, Vcc=3V, Vgsp1=0.5V; and Vgsn2, Vgsn3=0.5V.

$$Vcc - (Vgsp1 + Vgsn2) = R2/R1 \times (Vcc - Vgsn3)$$

$$3.0V - (0.5V + 0.5V) = R2/R1 \times (3.0V - 0.5V)$$

$$R2/R1 = 4/5 \quad (5)$$

The above is indicative that an ideal operation can be achieved when the design is carried out so that the ratio between the resistance values of resistors R1 and R2 of the level shifter unit 2 is 5:4.

In addition, supposing that, given the ratio 5:4 between the resistance values of the resistors R1 and R2, the state is changed in accordance with transistor threshold values changed due to process variations, such as: Vgsp1=0.8V; and Vgsn2, Vgsn3=0.8V. In this case, the relational expression takes the form of expression (6) given below.

$$Vcc - (Vgsp1 + Vgsn2) = 3.0V - (0.8V + 0.8V) = 1.4V$$

$$R2/R1 \times (Vcc - Vgsn3) = 4/5 \times (3.0V - 0.8V) = 1.76V$$

$$Vcc - (Vgsp1 + Vgsn2) \neq R2/R1 \times (Vcc - Vgsn3) \quad (6)$$

Consequently, the level shifted voltage $\Delta V$ is offset from the ideal value due to an offset in the transistor threshold value, thereby leading to, for example, an increase in offset voltage error and/or an offset in the ideal value I2.

Thus, according to the operational amplifier circuit of FIG. 1, the level shifted voltage $\Delta V$ can be preliminarily set to the ideal value by setting the resistance values of the resistors R1 and R2. When the transistor threshold value is offset due to process variations, however, the level shifted voltage $\Delta V$ is offset from the set value.

Thus, one drawback of operational amplifier circuit is that, in the state where the power supply voltage is low, the offset in the level shifted voltage $\Delta V$ associated with the offset in the transistor threshold value, poses the problem of significantly reducing the accuracy of the output signal of the operational amplifier circuit.

Japanese Laid-Open Publication No. 2002-43871 discloses an operational amplifier circuit, in which the sum of current values of bias currents for supply to first and second input differential pair is controlled to be constant, thereby suppressing fluctuations in characteristics due to process variations.

Japanese Laid-Open Publication No. 2001-60832 discloses a configuration for reducing power consumption in the preceding circuit for driving respective transistors of a complementarily connected output circuit.

Japanese Laid-Open Publication No. 06-85570 discloses an operational amplifier circuit apparatus including a P-top operational amplifier circuit and an N-top operational amplifier circuit, in which any one of the operational amplifier circuits is operated in accordance with the voltage level of an input signal.

Other objects, features, and advantages will be apparent to persons of ordinary skill in the art from the following description of the invention and the accompanying drawings.

SUMMARY

It is an aspect of the embodiments discussed herein to provide an operational amplifier circuit, including first and second differential amplifier circuits, at least one of which operates in response to an input signal within a voltage range between a high potential power supply and a low potential power supply, a level shifter unit outputting a level shifted signal generated by level shifting of output signals of the first and second differential amplifier circuits and an output circuit including complementary output transistors series being coupled between the high potential power supply and the low potential power supply and inputting the level shifted signal.

DETAILED DESCRIPTION OF THE EMBODIMENTS

Figure 1:
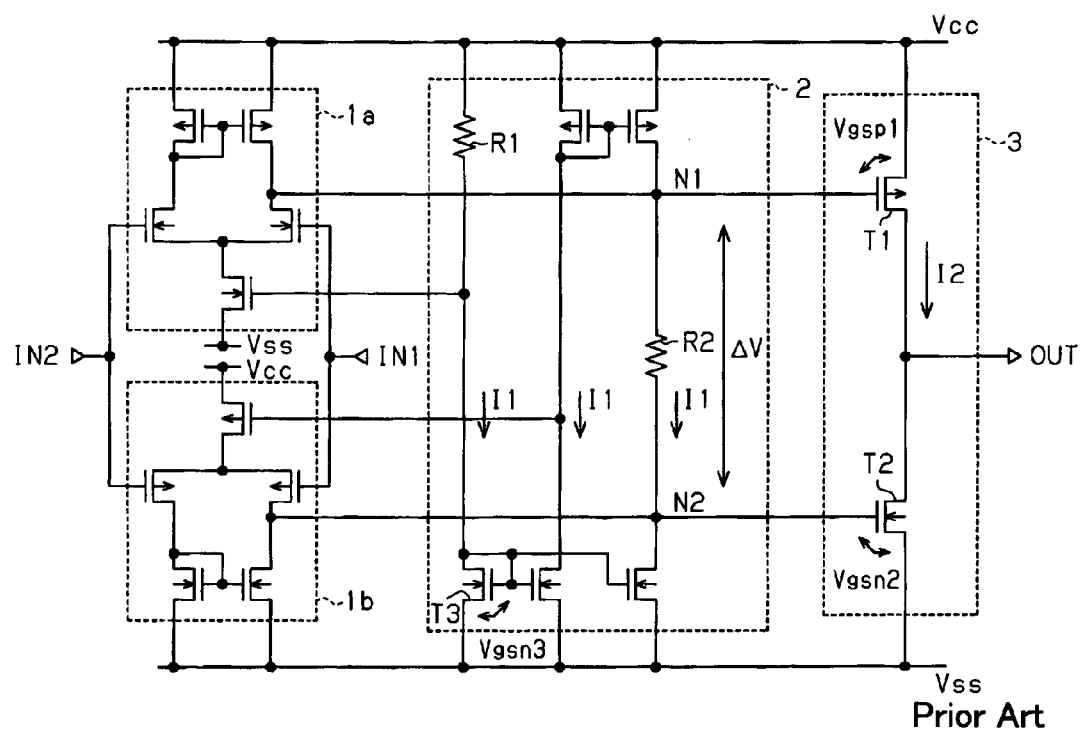
FIG. 1 illustrates a circuit diagram of a conventional example.
Figure 2:
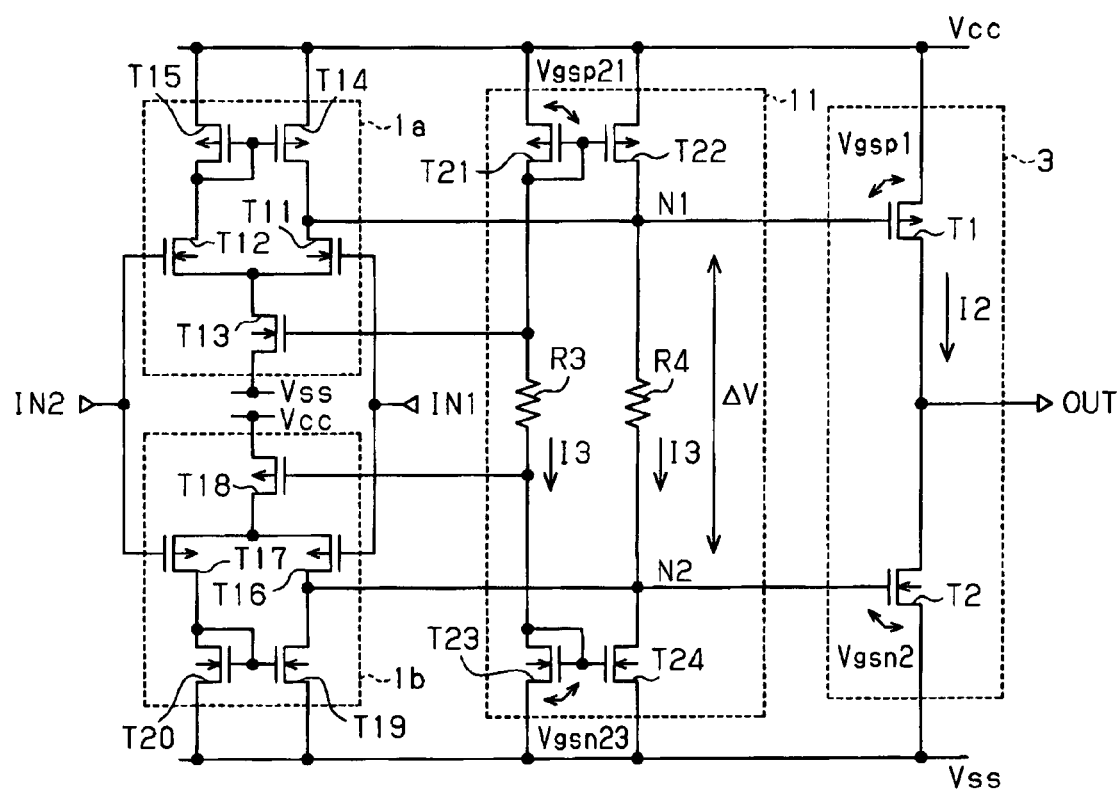
FIG. 2 illustrates an embodiment of an operational amplifier circuit.

FIG. 2 illustrates an embodiment of an operational amplifier circuit.

The operational amplifier circuit includes first and second differential amplifier circuits 1a and 1b, a level shifter unit 11, and an output circuit 3. In the first differential amplifier circuit 1a, input signals IN1 and IN2 are respectively input to gates of N-channel MOS transistors T11 and T12. The sources of transistors T11 and T12 are coupled to a drain of an N-channel MOS transistor T13. A source of the transistor T13 is coupled to a low potential power supply Vss.

A drain of the transistor T11 is coupled to a drain of a P-channel MOS transistor T14. A drain of the transistor T12 is coupled to a drain of a P-channel MOS transistor T15. The sources of transistors T14 and T15 are each coupled to a high potential power supply Vcc. The gates of transistors T14 and T15 are coupled to each other, and are further coupled to the drain of the transistor T15, whereby a current mirror circuit is configured.

In the second differential amplifier circuit 1b, the input signals IN1 and IN2 are input to the respective gates of P-channel MOS transistors T16 and T17. The sources of transistors T16 and T17 are coupled to a drain of a P-channel MOS transistor T18. A source of the transistor T18 is coupled to the high potential power supply Vcc.

A drain of the transistor T16 is coupled to a drain of an N-channel MOS transistor T19. A drain of the transistor T17 is coupled to a drain of an N-channel MOS transistor T20. The sources of transistors T19 and T20 are coupled to the power supply Vss. The gates of transistors T19 and T20 are coupled to each other, and are further coupled to the drain of the transistor T20, whereby a current mirror circuit is configured.

In the level shifter unit 11, the sources of P-channel MOS transistors T21 and T22 are coupled to the power supply Vcc. The gates of transistors T21 and T22 are coupled to each other, and further coupled to a drain of the transistor T21, whereby a current mirror circuit is configured.

The sources of N-channel MOS transistors T23 and T24 are coupled to the power supply Vss. The gates of the transistors T23 and T24 are coupled to each other and are further coupled to a drain of the transistor T23, whereby a current mirror circuit is configured.

The drains of transistors T21 and T23 are coupled together via a resistor R3. The drains of transistors T22 and T24 are coupled together via a resistor R4. A high potential terminal of the resistor R3 is coupled to a gate of the transistor T13, and a low potential terminal of the resistor R3 is coupled to a gate of the transistor T18. A resistance value of the resistor R3 and a resistance value of the resistor R4 are set to the same value.

The drains of transistors T11 and T14, which are output terminals of the first differential amplifier circuit 1a, are coupled to a drain (node N1) of the transistor T22 of the level shifter unit 11, and are further coupled to a gate of a pull-up transistor T1 (output transistor) of the output circuit 3.

The drains of transistors T16 and T19, which drains are output terminals of the second differential amplifier circuit 1b, are coupled to a drain (node N2) of the transistor T24 of the level shifter unit 11, and are further coupled to a gate of a pull-down transistor T2 (output transistor) of the output circuit 3.

In the level shifter unit 11, the transistors T21 and T22 and the transistors T23 and T24 perform current mirror operations, and the same current I3 flows to the resistors R3 and R4.

As such, a level shifted voltage ΔV, which is a voltage between two terminals of the resistor R4, i.e., a voltage between the nodes N1 and N2, is represented by expression (7) below:

$$\Delta V = Vcc - (Vgsp21 + Vgsn23) \quad (7)$$

where Vgsp21 is a gate-source voltage of the transistor T21; and Vgsp23 is a gate-source voltage of the transistor T23.

Accordingly, the gate-source voltage of each of the transistors T21 and T23 operates as a voltage regulating unit.

In order to attain an ideal operation of the operational amplifier circuit, the level shifted voltage ΔV is set to satisfy expression (8) below.

$$Vcc - (Vgsp1 + Vgsn2) = Vcc - (Vgsp21 + Vgsn23) \quad (8)$$

The sizes of the respective output transistors T1 and T2 and the transistors T21 to T24 of the level shifter unit 11 are determined to satisfy expression (9) below, regardless of process variations.

$$Vgsp1 = Vgsp21, Vgsn2 = Vgsn23 \quad (9)$$

Operation of the operational amplifier circuit thus configured will now be described herebelow.

The first and second differential amplifier circuits 1a and 1b operate in accordance with the respective input signals IN1 and IN2. The potentials of the respective nodes N1 and N2 vary, and an output signal OUT is output in accordance with the variations in the potentials.

For example, when the potential of the input signal IN1 rises relative to the input signal IN2, the potential of the node N1 is reduced in accordance with the operation of the first differential amplifier circuit 1a. The potential of the node N2 is reduced in accordance with the operation of the second differential amplifier circuit 1b. Then, the drain current of the output transistor T1 is increased, and the drain current of the output transistor T2 is reduced, whereby the voltage of the output signal OUT is increased.

Alternatively, when the potential of the input signal IN1 falls relative to the input signal IN2, the potential of the node N1 is increased in accordance with the operation of the second differential amplifier circuit 1b. Then, the potential of the node N2 is increased in accordance with the operation of the second differential amplifier circuit 1b. Consequently, the drain current of the output transistor T1 is reduced, and the drain current of the output transistor T2 is increased, whereby the voltage of the output signal OUT is reduced.

Under such an operation, the level shifted voltage ΔV is maintained constant, regardless of variations in the potentials of the respective nodes N1 and N2.

When a potential difference between the input signal IN1, IN2 and the level of the power supply Vcc becomes lower than or equal to a threshold value of the P-channel MOS transistor, the second differential amplifier circuit 1b becomes inoperable. In this case, the potentials of the nodes N1 and N2 are set in accordance with the output signal of the first differential amplifier circuit 1a in accordance with the potential difference between the nodes N1 and N2 and the operation of the level shifter unit 11, so that the output signal OUT is output in accordance with the potential difference between the input signals IN1 and IN2. In this event, the level shifted voltage ΔV is maintained toat the value indicated in expression (6).

Alternatively, when a potential difference between the input signal IN1, IN2 and the level of the high voltage power supply Vss becomes lower than or equal to a threshold value of the N-channel MOS transistor, the first differential amplifier circuit 1a becomes inoperable. In this case, the potentials of the nodes N1 and N2 are set in accordance with the output signal of the second differential amplifier circuit 1b in accordance with the potential difference between the input signals IN1 and IN2 and the operation of the level shifter unit 11, so that the output signal OUT is output in accordance with the potentials of the nodes N1 and N2

According to the operational amplifier circuit configured as described above, effects and advantages described below can be obtained. They are:

(1) The output signal OUT can be normally output in response to the input signals IN1 and IN2, respectively, in the ranges of the high potential power supply Vcc and the high voltage power supply Vss.

(2) Even when the threshold values of the output transistors T1 and T2 and the threshold values of the transistors T21 to T24 of the level shifter unit 11 are fluctuated due to process variations, the operational amplifier circuit can operate at all times under the condition satisfying expression (8).

(3) Regardless of process variations, the level shifted voltage ΔV between the nodes N1 and N2 can be maintained the ideal value, so that accuracy of the output signal OUT can be secured.

Figure 3:
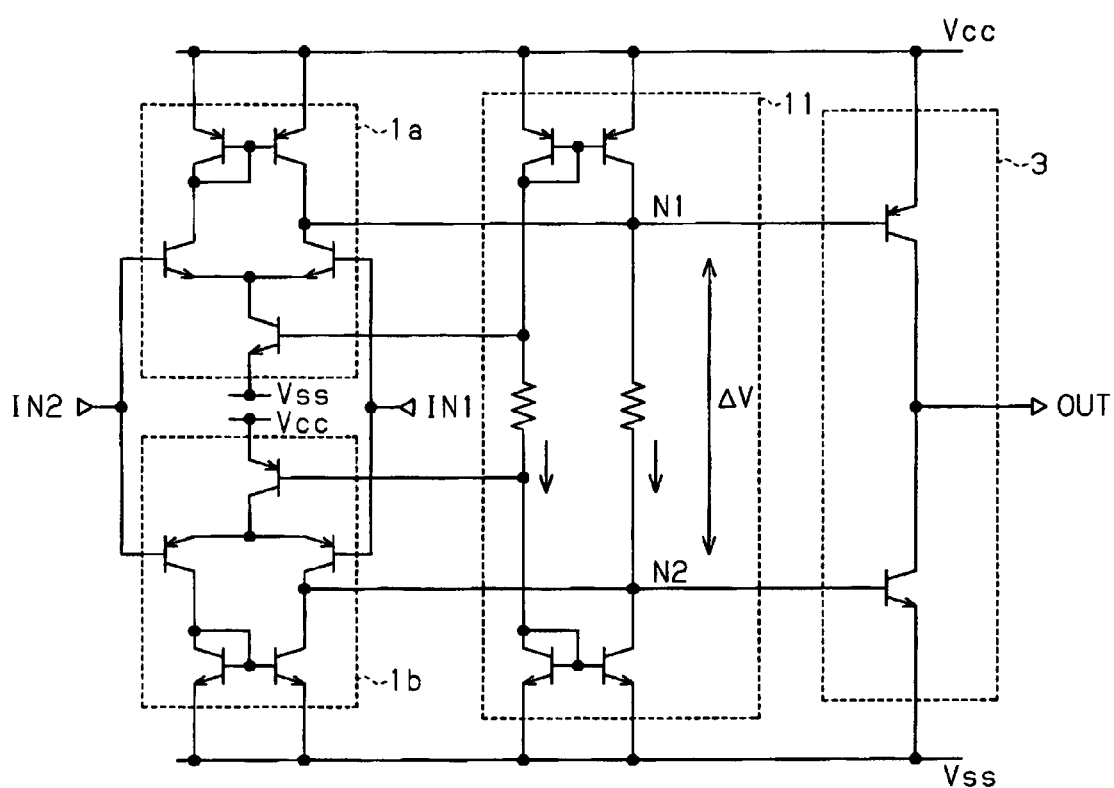
FIG. 3 illustrates another embodiment of an operational amplifier circuit.

FIG. 3 illustrates an operational amplifier circuit of another embodiment. The embodiment is configured in a manner that the MOS transistors of the above-described first embodiment are replaced with bipolar transistors. More specifically, the P-channel MOS transistors, respectively constituting the first and second differential amplifier circuits 1a and 1b, level shifter unit 11, and output circuit 3, are replaced with PNP transistors, and the N-channel MOS transistors are respectively replaced with NPN transistors.

According to the operational amplifier circuit thus configured, similar effects and advantages as those of the first embodiment can be obtained. Further, compared to the operational amplifier circuit configured with the MOS transistors, threshold value fluctuations due to process variations can be suppressed, and operation speeds can be improved even more.

The embodiments described above can be effectuated with the following arrangements:
The resistors R3 and R4 do not have to necessarily be set to the same resistance value; and
The transistors T1 and T21 or the transistor T2 and T23 do not have to have the same size, inasmuch as the threshold value fluctuations due to process variations are identical to each other.

While the present invention has been described in connection with preferred embodiments, it will be understood by those skilled in the art that variations and modifications of the preferred embodiments described above may be made without departing from the scope of the invention. Other embodiments will be apparent to those skilled in the art from a consideration of the specification or from a practice of the invention disclosed herein.

What is claimed is:

1. An operational amplifier circuit, comprising:
first and second differential amplifier circuits, at least one of which operates in response to an input signal within a voltage range between a high potential power supply and a low potential power supply;
a level shifter unit outputting a level shifted signal generated by level shifting of output signals of the first and second differential amplifier circuits; and
an output circuit including complementary output transistors series being coupled between the high potential power supply and the low potential power supply and inputting the level shifted signal;
wherein the level shifter unit outputs the level shifted voltage as a voltage obtained by a subtraction of threshold values of the complementary output transistors from a potential difference between the high potential power supply and the low potential power supply, and wherein the level shifter unit includes a voltage regulating unit regulating the level shifted voltage so as to cancel variations in the threshold values of the complementary output transistors.

2. An operational amplifier circuit according to claim 1, wherein:
the complementary output transistors series includes a P-channel MOS transistor and a N-channel MOS transistor;
wherein the level shifter unit includes:
a current mirror circuit including a pair of P-channel MOS transistors, each of the pair of transistors having a source coupled to the high potential power supply; and
a current mirror circuit including N-channel MOS transistors each having a source coupled to the low potential power supply;
wherein the current mirror circuits are connected together via a resistor; and
wherein a terminal-to-terminal voltage of the resistor is output as the level shifted voltage to the output circuit, and the P-channel MOS transistor and the N-channel MOS transistor of the current mirror circuits are operated to serve as the voltage regulating unit.

3. An operational amplifier circuit according to claim 1, wherein:
the complementary output transistor series includes a PNP transistor and an NPN transistor;
wherein the level shifter unit includes:

a current mirror circuit including a pair of PNP transistors, each of the pair of transistors having an emitter coupled to the high potential power supply; and a current mirror circuit including NPN transistors, each having an emitter coupled to the low potential power supply;

wherein the current mirror circuits are connected together via a resistor; and wherein a terminal-to-terminal voltage of the resistor is output as the level shifted voltage to the output circuit, and the PNP transistor and the NPN transistor of the current mirror circuits are operated to serve as the voltage regulating unit.

4. An operational amplifier circuit according to claim 2, wherein sizes of the transistors included in the output circuit and sizes of the transistors included in the current mirror circuits are set so that threshold value fluctuations due to process variations are identical to each other.

5. An operational amplifier circuit according to claim 3, wherein sizes of the transistors included in the output circuit and sizes of the transistors included in the current mirror circuits are set so that threshold value fluctuations due to process variations are identical to each other.

* * * * *

UNITED STATES PATENT AND TRADEMARK OFFICE
CERTIFICATE OF CORRECTION

PATENT NO. : 7,532,071 B2  Page 1 of 1
APPLICATION NO. : 11/984261
DATED : May 12, 2009
INVENTOR(S) : Shinji Miyata It is certified that error appears in the above-identified patent and that said Letters Patent is hereby corrected as shown below:

On the Title Page -

Item [73] Assignee, please correct the Assignee's name to read as follows:
-- Fujitsu Microelectronics Limited --.

Signed and Sealed this

Ninth Day of March, 2010

David J. Kappos
*Director of the United States Patent and Trademark Office*